United States Patent [19]

Etter

[11] Patent Number: 5,446,435
[45] Date of Patent: Aug. 29, 1995

[54] CURRENT SENSOR COMPRISING A MAGNETIC CIRCUIT WITH AN AIR GAP

[75] Inventor: Marcel Etter, Troinex, Switzerland

[73] Assignee: Liaisons Electroniques-Mecaniques LEM S.A., Switzerland

[21] Appl. No.: 50,053

[22] PCT Filed: Mar. 20, 1991

[86] PCT No.: PCT/CH92/00163

§ 371 Date: Apr. 30, 1993

§ 102(e) Date: Apr. 30, 1993

[87] PCT Pub. No.: WO93/06491

PCT Pub. Date: Apr. 1, 1993

[30] Foreign Application Priority Data

Sep. 20, 1991 [CH] Switzerland ............... 2789/91-6

[51] Int. Cl.6 .............. H01F 17/06; H01F 27/24; H01F 27/30
[52] U.S. Cl. .................. 336/178; 336/198; 336/221; 336/234
[58] Field of Search ........... 336/198, 208, 178, 233, 336/234, 165, 221

[56] References Cited

U.S. PATENT DOCUMENTS

| | | | |
|---|---|---|---|
| 1,367,988 | 2/1921 | Replogle | 336/178 |
| 1,862,613 | 6/1932 | Tomoda | 336/175 |
| 1,863,936 | 6/1932 | Schwager . | |
| 2,867,785 | 1/1959 | Crumbliss | 336/178 |
| 3,750,073 | 7/1973 | Okano | 336/198 |
| 4,000,483 | 12/1976 | Cook et al. | 336/198 |
| 4,654,563 | 3/1987 | Boyd | 336/234 |
| 4,656,452 | 4/1987 | Martin et al. | 336/178 |

FOREIGN PATENT DOCUMENTS 737490 12/1932 France .

Primary Examiner—Thomas J. Kozma
Attorney, Agent, or Firm—Clifford W. Browning; Woodard, Emhardt, Naughton, Moriarty & McNett

[57] ABSTRACT

The magnetic circuit (1) is made in a single piece or consists of a stack of identically-shaped sheets. The height (H) of the air gap (2) is greater than the thickness (E) of a coil (5), enabling said coil to be inserted through the air gap. This structure is easily assembled during the mass production of current sensors which use such circuits.

8 Claims, 2 Drawing Sheets

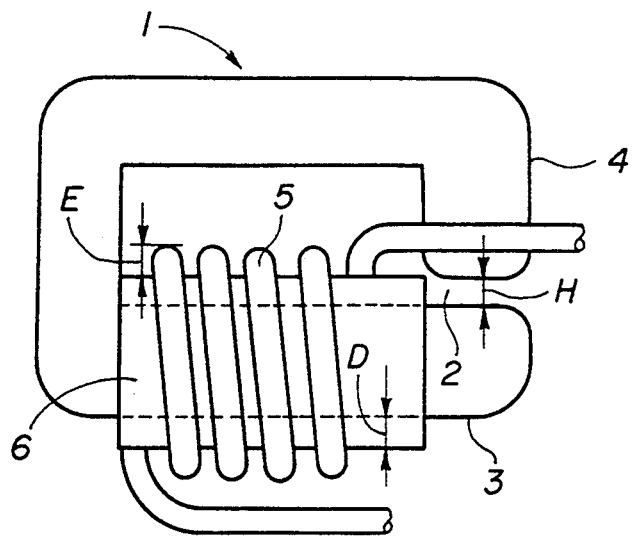
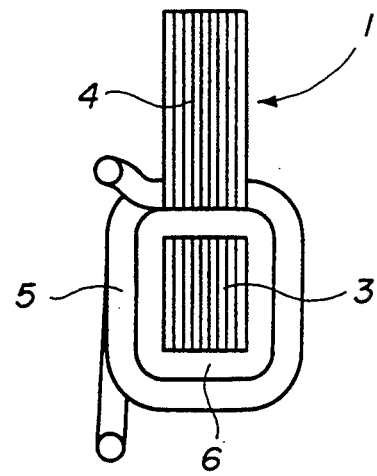
FIG. 1
FIG. 2
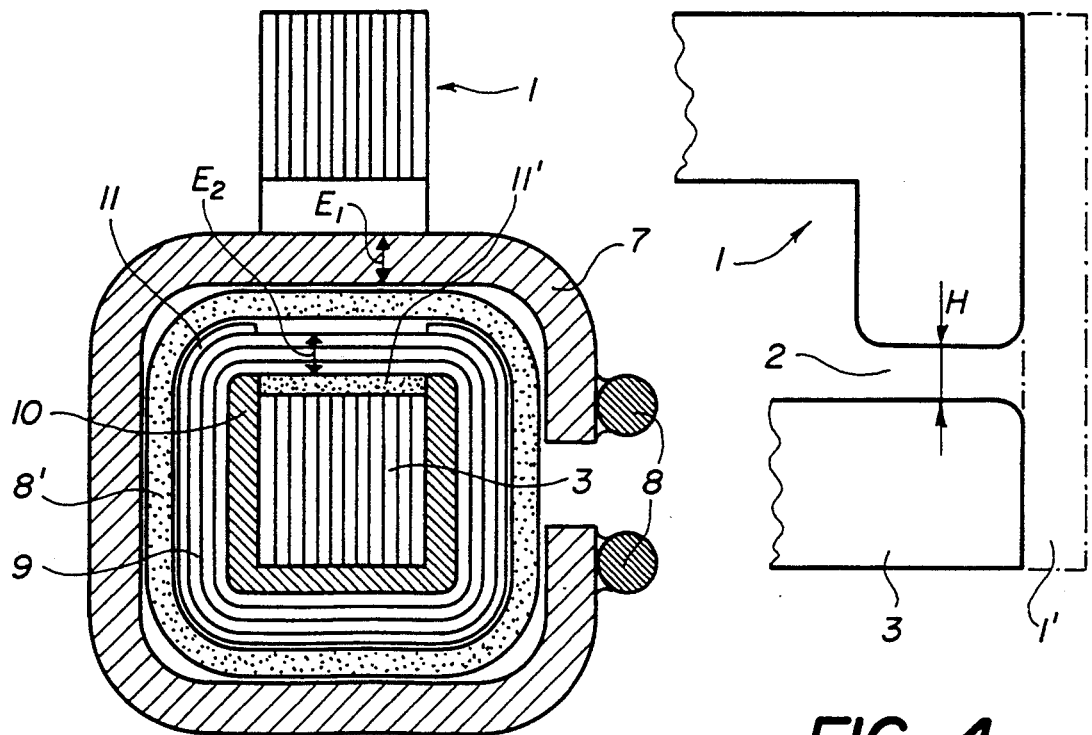
FIG. 3
FIG. 4

CURRENT SENSOR COMPRISING A MAGNETIC CIRCUIT WITH AN AIR GAP

The present invention relates to an electric current sensor comprising a magnetic circuit with an air-gap and at least one electric coil disposed around a branch of this circuit, this branch having the shape of an elongate rectangular parallelepiped. More particularly, the invention relates to open-loop sensors of the above mentioned type in which a Hall generator is arranged in the air-gap of the magnetic circuit.

In the present day sensors in which the magnetic circuit has only one air-gap, two separate pieces or stackings of two groups of pieces of sheet metal are required to allow the mounting of a coil on a branch of the magnetic circuit. Such a structure and the corresponding assembling process are expensive and render the installations for automatic assembling relatively complex, the major problem being the accomplishing of an interpenetration of the metal sheets of the usual lamellar magnetic circuits.

The invention aims at providing a current sensor of a substantially lower cost price than that of the existing sensors of the same type and at allowing, in particular, a much more simple mounting of the coil or coils onto the magnetic circuit.

To this end, the current sensor according to the invention is characterized in that the magnetic circuit consists of a single piece or of a corresponding stacking of metal sheets of same shape and has an air-gap extending parallelly to the branch on which said coil is arranged, the height of this air-gap being greater than the thickness of the coil, measured transversally to the longitudinal direction of said branch on one side thereof, so as to allow the positioning of the coil by passing it through the air-gap.

The sensor according to the invention can in particular comprise a self-supporting winding or a winding made on an insulating support having, at least over the length supporting the coil, a U-shaped cross-section, the open section of the U being turned towards the inside of the magnetic circuit. In this case, the support comprises preferably, on at least one of its ends, a flange, a portion of which, located at the open side of the U of the part of the support carrying the coil, has an inner height lesser than that of the air-gap. This portion of the flange can, in particular, have a height which is smaller at the side directed towards the outside of the support than at the side directed towards the coil.

According to the present invention, the coil can be placed on an insulating separated support which itself is arranged around said branch of the circuit, this support having, at least on one side of its cross-section, a thickness smaller than the height of the air-gap, so as to allow positioning the same inside the coil by passing it through the air-gap.

At least a second coil can be arranged inside a first coil, said second coil having a thickness, measured transversally to the longitudinal direction of said branch of the circuit at one side thereof, smaller than the height of the air-gap, so as to allow the positioning of this second coil on said branch of the circuit by passing it through the air-gap after the introduction of the first coil.

Preferably, the air-gap is formed between a side part of a free end of the branch of the magnetic circuit supporting the coil or coils, and a front part of a free end of a branch of the circuit substantially perpendicular to the branch supporting the coil or coils. In this case, the branch which is perpendicular to that supporting the coil or coils, can comprise an end with a cross-section greater than the sections of the other parts of the circuit.

According to a particular embodiment, a piece or a stacking of sheets of a magnetically permeable material is placed in contact with parts of the circuit adjacent to the air-gap, so as to form a magnetic bridge across the air-gap.

The invention will be better understood in the light of the following description of different embodiments given by way of example and illustrated in the appended drawing in which:

FIG. 1 is a side view of a magnetic circuit with an air-gap, provided with a coil for a sensor according to the invention;

FIG. 2 is a front view of the circuit of FIG. 1;

FIG. 3 is a cross-section of a similar magnetic circuit provided with two superimposed coils;

FIG. 4 is a partial view of the magnetic circuit of FIG. 3;

Figure 5:
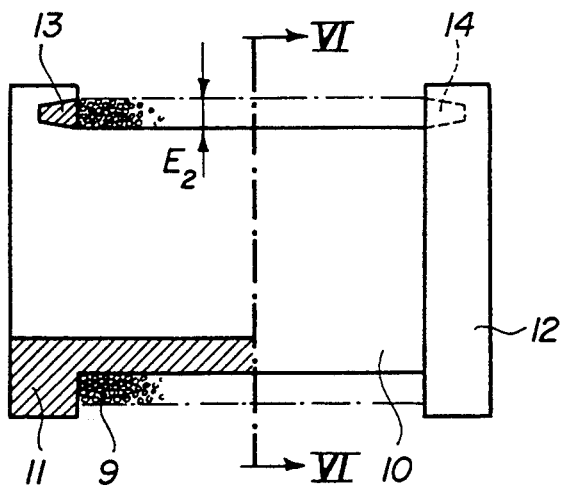
FIG. 5 is a side view, partially cross-sectional, of a coil support for use the arrangement of FIG. 3.

FIG. 1 shows a magnetic circuit 1 having an air-gap 2 formed between the side part of the end of a branch 3 of the circuit and the front part of a free end of a branch 4 perpendicular to the branch 3. The height H of the air-gap 2 is slightly greater than the thickness E of a coil 5 and the thickness D of a tubular insulating support 6. The magnetic circuit can be made of a single piece of ferrite or, as illustrated in FIG. 2, of a stacking of pieces of sheet metal of same shape assembled to form such a circuit.

The height H of the air-gap allows to introduce the coil 5 through this air-gap and then, in a second step, to introduce the support 6 inside this coil by slipping it on the branch 3.

FIG. 3 illustrates the case in which two windings are superimposed on the branch 3 of a magnetic circuit similar to that of FIG. 1 and represented partly in FIG. 4. A first winding 7 is, for example, comprised of a single flat turn 7 to which are soldered connecting wires 8. The turn 7 has a thickness E1 lesser than the height H of the air-gap 2 of circuit 3 and will be introduced first through this air-gap. Then an insulating tube 8', the outer dimensions of which are slightly smaller than the inner dimensions of the turn 7, is introduced in a similar manner and arranged inside the turn 7.

A winding 9 formed on an insulating support 10 is then also introduced through the air-gap 2 and placed inside the insulating tube 8. The body of the support 10 which supports the winding 9 has a U-shaped cross-section, the open part of which is directed towards the inside of circuit 1. This allows to confer to the winding 9 a maximum thickness corresponding to the height H of the air-gap since the support does not contribute to the overall height of the coil 9, 10 on the portion which is to pass through the air-gap 2. Finally, an insert 11' is introduced between the branch 3 of the circuit and the winding 9 at the location of the open side of the U of the support 10 to insulate the winding from the branch 3. This insert 11' is also introduced through the air-gap.

FIG. 4 further shows schematically a magnetically permeable piece 1' which can be placed in contact with the parts of the circuit 1 adjacent to the air-gap 2 to form a magnetic bridge or shunt across the air-gap for improving the dynamic performances of the sensor, more particularly in the case of a compensation-type sensor. In another embodiment of the circuit, it is envisaged for this purpose to confer at least to the end of the branch facing branch 3 a cross-section greater than that of the rest of the circuit.

Figure 6:
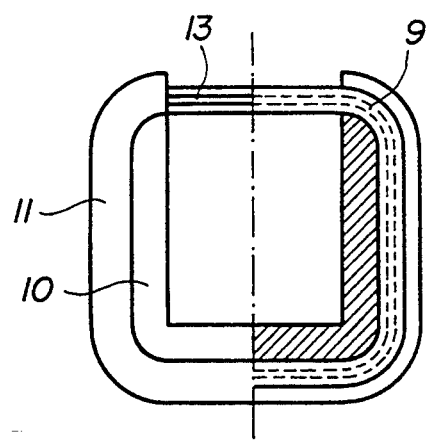
FIG. 6 is a front view, partially cross-sectional, according to the line VI—VI of FIG. 5.

FIGS. 5 and 6 show the coil 9, 10 of FIG. 3, the winding 9 being indicated only partly and the support 10 being shown partly in cross-section. The two ends of the support 10 consist of flanges 11, 12 which have, at the location of a respective portion 13, 14, a reduced section the height of which corresponds to the thickness E2 of the winding 9. The portions 13, 14 correspond to the inner width of the U-shaped body of the support 10 and are designed for passing through the air-gap 2 when the coil is positioned. To facilitate the insertion of the whole assembly through the air-gap, the section of the portions 13, 14 can be trapezoidal as illustrated in FIGS. 5 and 6.

Figure 7:
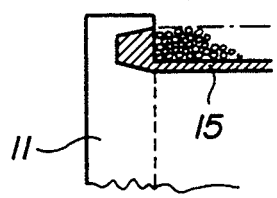
FIG. 7 is a detail illustrating an alternate embodiment of the support of FIG. 5.
Figure 8:
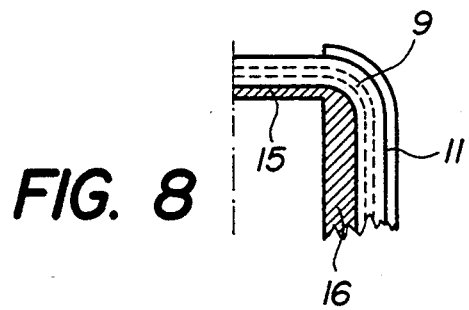
FIG. 8 is a partial view similar to that of FIG. 6, for the alternate embodiment according to FIG. 7.

FIGS. 7 and 8 illustrate an alternate embodiment of the support 10, according to which an insulating wall 15 is integral with the body of a support 16, this wall having a small thickness so as to reduce the maximum thickness E2 of the winding only by a small amount. In this case, an insert such as 11' is generally no more necessary.

Figure 9:
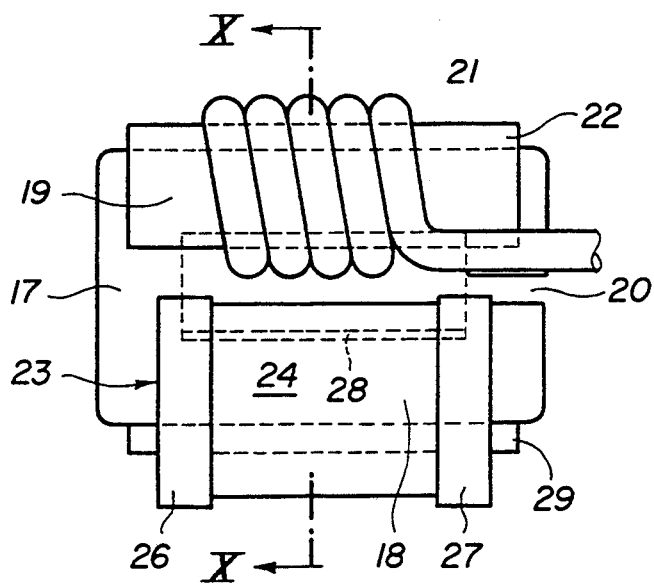
FIG. 9 is a side view of a magnetic circuit carrying two coils on different branches.
Figure 10:
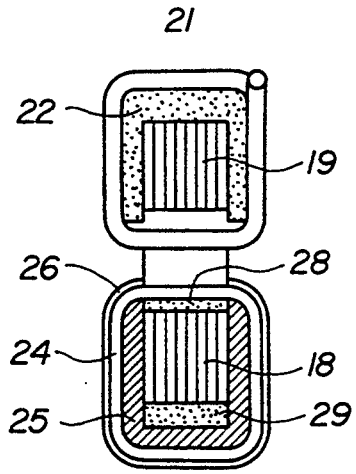
FIG. 10 is a cross-sectional view along the line X—X of FIG. 9.

FIGS. 9 and 10 illustrate an embodiment in which a magnetic circuit 17 is formed of a stacking of C-shaped metal sheets. Two coils are arranged, respectively, on parallel branches 18 and 19 of this circuit, their positioning being carried out in a similar manner as in the preceding examples by passing it through the air-gap 20 of this circuit. As shown by way of example, a coil 21 of thick wire is placed on an insulating support 22 which, in this case, has a U-shaped cross-section and can be introduced between the coil and the branch 19 from outside the circuit. A coil 23 comprises a winding 24 made on a support 25, the body of which, which supports the winding, has also the shape of a U open towards the inside of the circuit. Flanges 26, 27 are cut out so as to allow the coil to pass through the air-gap 20 with a thickness of the winding slightly smaller than the height of the air-gap. An intermediate insulating piece 28 can be arranged beforehand on the branch 18, so that the winding 24 does not come into contact with this branch once the coil is positioned. Furthermore, an insert 29 is introduced between the branch 18 and the support 25 from outside the circuit.

The above examples are of course in no way limiting and numerous other forms and embodiments are within the reach of a man skilled in the art.

I claim:

1. An electric current sensor comprising a magnetic circuit with an air-gap and at least one electric coil arranged around a branch of this circuit, this branch having the shape of an elongate rectangular parallelepiped, said magnetic circuit consisting of a single stacking of metal sheets all of said metal sheets being of the same size and shape, and there being only one of said metal sheets per stack layer and having an air-gap extending parallely to the branch on which the coil is arranged, the height of this air-gap being greater than the thickness of the coil measured transversally to the longitudinal direction of said branch, on one side thereof, so as to allow the positioning of the coil by passing it through the air-gap, said coil comprising a winding formed or an insulating support having, at least over the length supporting the winding, a U-shaped cross-section, the open end of the U being directed towards the inside of the magnetic circuit.

2. A sensor according to claim 1, wherein the support comprises, at least at one of its ends, a flange of which a portion which is located on the open side of the U of the support part carrying the winding has a height lesser than that of the air-gap.

3. A sensor according to claim 2, wherein said flange portion has a smaller height on the side directed outwards of the support that on the side directed towards the winding.

4. An electric Current sensor comprising a magnetic circuit with an air-gap and at least one electric coil arranged around a branch of this circuit, this branch having the shape of an elongate rectangular parallelepiped, said magnetic circuit consisting of a single stacking of metal sheets all of said metal sheets being of the same size and shape, and their being only one of said metal sheets per stack layer and having an air-gap extending parallely to the branch on which the coil is arranged, the height of this air-gap being greater than the thickness of the coil measured transversally to the longitudinal direction of said branch, on one side thereof, so as to allow the positioning of the coil by passing it through the air-gap, said coil being placed on a separate insulating support, which is itself arranged around said branch of the circuit, this support having, at least on one side of its cross-section, a smaller thickness than the height of the air-gap, so as to allow its positioning inside the coil by passing it through the air-gap, the total thickness of said coil and of said insulating support being larger than the height of said air-gap.

5. A sensor according to claim 4, wherein at least a second coil is arranged inside a first coil, this second coil having a thickness, measured transversally to the longitudinal direction of said branch of the circuit on one side thereof, smaller than the height of the air-gap, so as to allow the positioning of this second coil on said branch of the circuit by passing it through the air-gap after the introduction of the first coil.

6. A sensor according to claim 4, wherein the air-gap is formed between a side part of a free end of the branch of the magnetic circuit bearing the coil and a front part of a free end of a branch of the circuit substantially perpendicular to the branch bearing the coil.

7. Sensor according to claim 6, characterized in that said branch, perpendicular to that bearing the coil, comprises an end having a cross-section greater than the sections of the other parts of the circuit.

8. A sensor according to claim 4, wherein a piece of a magnetically permeable material is placed in contact with parts of the circuit adjacent to the air-gap, so as to form a magnetic bridge across the air-gap.

* * * * *

UNITED STATES PATENT AND TRADEMARK OFFICE
CERTIFICATE OF CORRECTION

PATENT NO. : 5,446,435
DATED : August 29, 1995
INVENTOR(S) : Marcel Etter

It is certified that error appears in the above-identified patent and that said Letters Patent is hereby corrected as shown below:

In column 4, line 9, please delete "or" and insert in lieu thereof --on--.

In column 4, line 24, please delete "Current" and insert in lieu thereof --current--.

Signed and Sealed this

Thirtieth Day of January, 1996

Attest:

Attesting Officer

BRUCE LEHMAN

Commissioner of Patents and Trademarks